(12) United States Patent
Luecke et al.

(10) Patent No.: US 7,873,097 B1
(45) Date of Patent: Jan. 18, 2011

(54) SYSTEMS AND METHODS FOR CONCATENATION IN SPREAD SPECTRUM SYSTEMS

(75) Inventors: James R. Luecke, Mission Viejo, CA (US); Keith R. Jones, Laguna Niguel, CA (US)

(73) Assignee: Interstate Electronics Corporation, Anahem, CA (US)

( * ) Notice: Subject to any disclaimer, the term of this patent is extended or adjusted under 35 U.S.C. 154(b) by 692 days.

(21) Appl. No.: 11/858,760

(22) Filed: Sep. 20, 2007

Related U.S. Application Data (60) Provisional application No. 60/826,368, filed on Sep. 20, 2006.

(51) Int. Cl.
*H04B 1/00* (2006.01)
(52) U.S. Cl. ..................................... 375/147
(58) Field of Classification Search ................. 375/147
See application file for complete search history.

(56) References Cited

U.S. PATENT DOCUMENTS

| | | | | |
|---|---|---|---|---|
| 5,103,459 | A * | 4/1992 | Gilhousen et al. | 370/206 |
| 5,325,394 | A * | 6/1994 | Bruckert | 375/148 |
| 5,559,829 | A * | 9/1996 | Le Strat et al. | 375/141 |
| 6,108,327 | A * | 8/2000 | Schilling et al. | 370/342 |
| 6,128,332 | A * | 10/2000 | Fukawa et al. | 375/146 |
| 6,141,373 | A * | 10/2000 | Scott | 375/150 |
| 6,181,729 | B1 * | 1/2001 | O'Farrell | 375/130 |
| 2004/0105489 | A1 * | 6/2004 | Kim et al. | 375/140 |
| 2009/0323766 | A1 * | 12/2009 | Wang et al. | 375/130 |

OTHER PUBLICATIONS

Elders-Boll, "Fast acquisition in DS-CDMA using concatenated spreading sequences",1997 First IEEE Signal Processing Workshop on Signal Processing Advances in Wireless Communications, Publication Year: 1997 , pp. 373-376.*

Mizutani, "Design of pseudo-noise sequences for a spread spectrum communication and ranging system" Proceedings of the IEEE Intelligent Vehicles Symposium, 2000. IV 2000, Publication Year: 2000, pp. 418-423.*

Kurskii, "Development of the approaches to UMTS requirements in the CTDMA radio interface" Proceedings, 1998 IEEE 5th International Symposium on Spread Spectrum Techniques and Applications, 1998. vol. 2, Publication Year: 1998 , pp. 634-638 vol. 2.*

(Continued)

*Primary Examiner*—Juan A Torres
(74) *Attorney, Agent, or Firm*—Knobbe Martens Olson & Bear LLP (57) ABSTRACT

A receiver despreads a spread spectrum sequence by partially despreading the spread spectrum sequence using an outer spreading code, and then despreading the partially despread sequence using an inner spreading code. This can advantageously save processing power. In one embodiment, the outer spreading code is despread with an analog circuit, and an inner spreading code is despread with a digital circuit. A modulator for a transmitter can generate a spread spectrum sequence by direct-sequence spreading data to generate a partially spread sequence and then spreading the partially spread sequence to generate the spread spectrum sequence.

23 Claims, 6 Drawing Sheets

OTHER PUBLICATIONS

Elders-Boll, "Mismatched-filtering of concatenated spreading sequences for approximately synchronized CDMA-systems" IEEE 46th Vehicular Technology Conference, 1996 'Mobile Technology for the Human Race, vol. 3, Publication Year: 1996, pp. 1727-1731 vol. 3.*

Elders-Boll, "Interference parameters of concatenated spreading sequences for asynchronous CDMA," 1996, IEEE 4th International Symposium on Spread Spectrum Techniques and Applications Proceedings, vol. 3, Publication Year: 1996, pp. 960-964 vol. 3.*

Maskara, "Concatenated Sequences for Spread Spectrum Systems" IEEE Transactions on Aerospace and Electronic Systems, vol. AES-17, Issue: 3 Publication Year: 1981, pp. 342-350.*

Cacopardi, "New concatenated sequences for wireless indoor asynchronous DS-CDMA communications" 1996 IEEE International Conference on 1996 IEEE International Conference on Communications, 1996, ICC 96, Conference Record, Converging Technologies for Tomorrow's Applications. vol. 1 Publication Year: 1996, pp. 63-67 vol. 1.*

Fong, "Concatenated orthogonal/PN spreading sequences and their application to cellular DS-CDMA systems with integrated traffic" IEEE Journal on Selected Areas in Communications, vol. 14, Issue: 3, Publication Year: 1996, pp. 547-558.*

El-Khamy, "Matched Spread Spectrum Techniques ," MILCOM 1982 IEEE Military Communications Conference—Progress in Spread Spectrum Communications, 1982 vol. 1 Publication Year: 1982, pp. 15.6-1-15.6-5.*

Mizutani, "Performance evaluation of spread spectrum communication and ranging system with interference from other vehicles" IEEE Intelligent Vehicle Symposium, 2002 vol. 2, Publication Year: 2002, pp. 378-386 vol. 2.).*

Mizutani, "Inter-vehicle spread spectrum communication and ranging system with concatenated EOE sequence" IEEE Transactions on Intelligent Transportation Systems, vol. 2, Issue: 4 Publication Year: 2001, pp. 180-191).*

* cited by examiner

SYSTEMS AND METHODS FOR CONCATENATION IN SPREAD SPECTRUM SYSTEMS

CROSS-REFERENCE TO RELATED APPLICATION

This application claims the benefit under 35 U.S.C. §119 (e) of U.S. Provisional Application No. 60/826,368, filed Sep. 20, 2006, the entirety of which is hereby incorporated by reference.

BACKGROUND OF THE INVENTION

1. Field of the Invention

The invention generally relates to electronics, and in particular, to spread-spectrum communications.

2. Description of the Related Art

Spread spectrum communication techniques offer many benefits in communications systems. These benefits include resistance to detection and/or interception as well as resistance to jamming. In a spread-spectrum system, the data is spread, that is, increased in bandwidth before it is transmitted across a data channel. When received, the data is despread back to the original data.

The amount of spreading determines the processing gain of the spread-spectrum system. Generally, the benefits of spread-spectrum modulation increase with increased processing gain. However, increasing the processing gain of the system increases the number of channel symbols transmitted, which also increases the signal processing rate required to demodulate the signal. High data processing rates are more difficult to implement in hardware or in software. For example, circuits (or microprocessors/signal processors implementing software) can be limited by maximum circuit speed, heat dissipation, or even by power consumption, particularly when battery powered.

BRIEF DESCRIPTION OF THE DRAWINGS

These drawings and the associated description herein are provided to illustrate specific embodiments of the invention and are not intended to be limiting.

DETAILED DESCRIPTION OF PREFERRED EMBODIMENTS

Concatenated spread spectrum techniques are disclosed herein. Such concatenated techniques permit a spread spectrum system to use a high processing gain while reducing the speed with which the digital logic operates, which makes the hardware and/or software easier to implement and decreases power consumption for longer battery life and less power dissipation. Such techniques are useful in a broad variety of transmitter/receiver applications, such as, but not limited to, personal communication devices, cellular telephony, satellite communications, satellite TV, digital cable, satellite positioning or navigation devices, wireless communications (phones, wireless email, peripheral devices), and the like. Techniques can also be used for ranging (determining distance) between two or more devices.

System Example

For the purposes of illustration and example, concatenation techniques will now be described in the context of concatenation of two direct sequence (DS) modulation codes. However, the skilled artisan will appreciate that the principles and advantages described herein are applicable to two or more concatenated codes and to other types of spread spectrum codes. For example, frequency hopping (FH) modulation and time hopping (TH) modulation can also be concatenated. In addition, the type of modulation concatenated can be mixed, for example, a direct sequence (DS) modulation can be concatenated with a frequency hopping (FH) modulation. The disclosed concatenation techniques process two or more spread-spectrum modulations in series, which is different from the product code used in hybrid modulation schemes.

Figure 1:
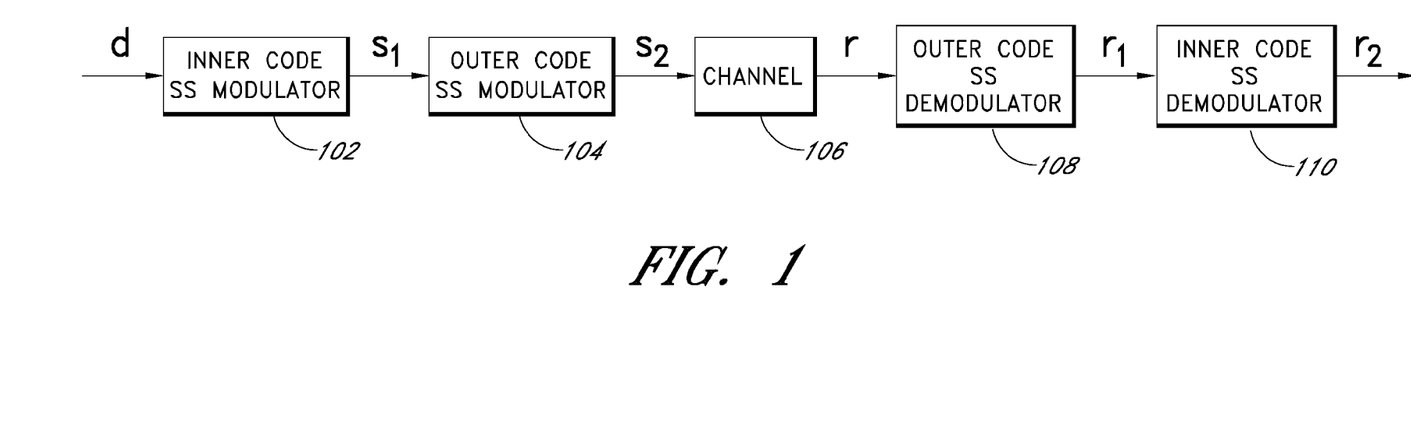
FIG. 1 illustrates an example of a concatenated spread spectrum system.

FIG. 1 illustrates an example of a concatenated spread spectrum system. In the illustrated system, two spread-spectrum modulators are concatenated (and two spread-spectrum demodulators are concatenated). However, the disclosed techniques are applicable to the concatenation of two or more modulators/demodulators. The data is spread-spectrum modulated on the transmit side via a concatenated modulator. The spread-spectrum signal is then transmitted over a channel. A receiver then despreads the concatenated spread spectrum signal. In the illustrated example, both the transmitter and the receiver use concatenated spread-spectrum modulators/demodulators. However, in another system, only one of the transmitter or receiver uses concatenation, and the other uses a spreading code that is a combination of an inner code and an outer code.

Transmitter

Data (d) is processed by a first spread spectrum modulator illustrated as an inner code spread spectrum (SS) modulator 102. In one embodiment, the inner code SS modulator is a direct sequence (DS) modulator. It will be understood that prior to processing by the inner code SS modulator, the data (d) can be processed by, for example, bit interleaving, forward error correction, encryption coding, or the like.

After processing by the inner code SS modulator 102, the inner code spread spectrum sequence $S_1$ is provided as an input to a second SS modulator illustrated as an outer code SS modulator 104. For example, for each symbol of the first spread sequence $S_1$, a pattern of pseudo-random noise (PRN) codes can be selected for spreading. In one embodiment, the outer code SS modulator is implemented by a lookup table, such as a ROM lookup table. This code can be considered to be block spread. A wide variety of other SS modulation implementations will be readily determined by one of ordinary skill in the art. The resulting outer code spread spectrum sequence $S_2$ has a symbol rate of $R_d M_1 M_2$, where $R_d$ is the input bit rate, $M_1$ is the inner code spreading factor, and $M_2$ is the spreading factor of the outer code. The spreading factor is defined as the ratio of the input symbol rate of a spread spectrum modulator to the output symbol rate of the modulator.

The outer code spread spectrum sequence $S_2$ is then transmitted over a channel 106. Such transmission can include, as applicable, multiplexing, upconversion, RF modulation, RF power amplifiers, antennas, and the like.

Receiver

A receiver receives the transmitted signal. The receiver can include, for example, an antenna, receiver front-end, down-conversion, and the like. The received spread spectrum sequence (r) is provided as an input to a first SS demodulator. The receiver can be embodied in a variety of electronics devices, such as, but not limited to, a transceiver for 2-way communications, in a mobile phone, in a wireless modem, in a navigation receiver, or the like.

The first SS demodulator is illustrated as an outer code SS demodulator 108, and despreads the spreading from the outer code SS modulator 104. The partially despread sequence ($r_1$) is provided as an input to a second SS demodulator, illustrated as an inner code SS demodulator 110, which despreads the partially despread sequence ($r_1$) to the despread sequence ($r_2$). Assuming that there are no errors due to the transmission channel 106, then the despread sequence ($r_2$) should be the same as the original data (d). However, if there is an error from the transmission channel 106, the data may differ and forward error correction (FEC) techniques can be used to correct the errors.

Implementation Details

Depending on the complexity of the spread-spectrum coding and operating speeds, the disclosed techniques can be implemented by hardware or by software, or by a combination of both hardware and software. In addition, hardware techniques can be implemented by digital circuits or by analog circuits, or by hybrid circuits utilizing both digital and analog circuits.

Receiver Implementation

It will be apparent to the skilled practitioner that a variety of circuits or techniques can be used to generate a receiver that performs the complementary despreading to the spreading of a transmitter. It should be noted that frequency offsets can exist between a receiver and a transmitter, and that the despreading circuits preferably have adjustable timing to compensate for differences in clock rates. Examples of sources of timing differences include clock offsets and doppler shifts (when the receiver and the transmitter are moving relative to each other). A receiver sync loop can be used to adjust the timing.

Figure 2:
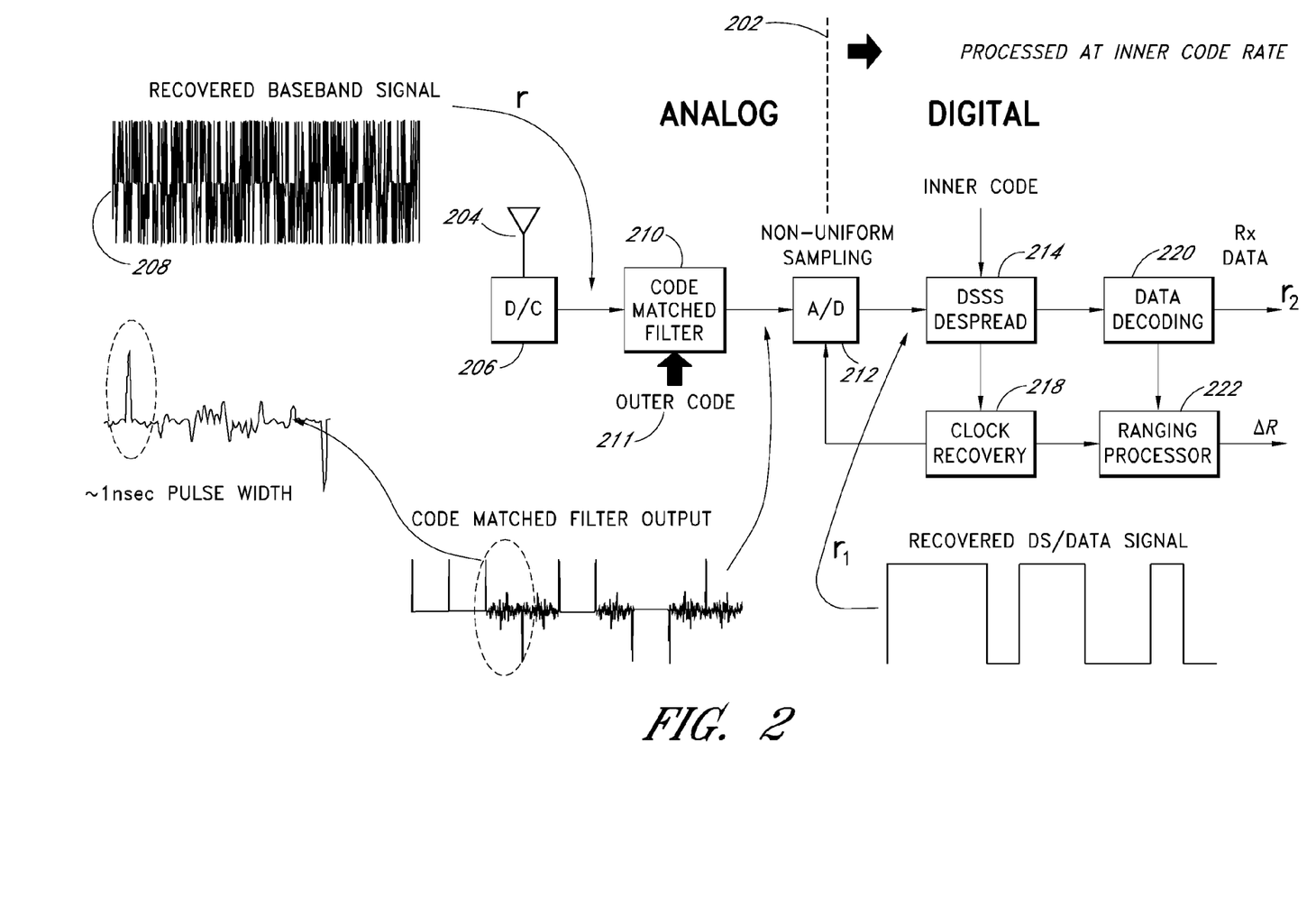
FIG. 2 illustrates an example of a receiver architecture.

FIG. 2 illustrates an embodiment of a hybrid analog/digital receiver architecture. In the illustrated embodiment, the outer code demodulation is performed in the analog domain. This facilitates the use of lower digital processing rates and an overall reduction in power consumption.

The outermost code SS demodulator, e.g., the outer code SS demodulator 108 (FIG. 1), will typically operate at the highest speed and can be relatively more difficult to implement than the another SS demodulator, such as the inner code SS demodulator 110 (FIG. 1). To save power, it can be more efficient to implement the higher speed portions of the receiver, such as the outer code SS demodulator 108 (FIG. 1) in analog as illustrated in FIG. 2. In the illustrated embodiment, the inner code SS demodulator 110 (FIG. 1) is implemented in digital.

A dashed line 202 separates analog circuits to the left and digital circuits to the right. An antenna 204 receives an RF signal carrying the concatenated spread spectrum signal. Multiple RF signals and multiple concatenated spread spectrum signals can be received at the same time. A downconverter 206 downconverts the RF signal to recover a baseband signal 208. The baseband signal 208 is provided as an input to a code matched filter 210. Code matched filters can be implemented in analog domain or in digital domain. The illustrated code matched filter 210 is analog. A digital implementation will be described later in connection with FIG. 4.

The coefficients of the code matched filter 210 are determined by the coefficients used for the outer code. In one embodiment, the coefficients of the code matched filter 210 remain fixed over time. The outer code 211 should match the code used to spread the data by the outer code SS modulator 104. In one embodiment, the outer code used by the outer code SS modulator 104 is similarly fixed over time. The code matched filter 210 generates the partially despread sequence ($r_1$) as an output. Examples of waveforms for the output of the code matched filter 210 are illustrated in FIG. 2. For the waveforms, synchronization or acquisition of the outer code 211 and the recovered baseband signal (r) has been assumed.

The partially despread sequence ($r_1$) is provided as an input to an analog-to-digital converter (A/D converter) 212. In the illustrated embodiment, the A/D converter 212 is configured to sample the partially despread sequence ($r_1$) in a non-uniform manner. As illustrated by the waveforms in FIG. 2, the partially despread sequence ($r_1$) has correlation peaks. Information for despreading of the inner code is contained in these correlation peaks and the A/D converter 212 can be efficiently configured to sample substantially only the correlation peaks. Synchronization of the timing for sampling of the A/D converter 212 is performed by a clock recovery circuit 218 such that the sampling is aligned with the correlation peaks from the code matched filter 210. Other uses for these correlation peaks are also described later in connection with FIG. 6. One embodiment of an A/D converter 212 with non-uniform sampling will be described in greater detail later in connection with FIG. 5.

The output of the A/D converter 212 is provided as an input to a direct sequence spread spectrum (DSSS) despreading circuit 214. Conventional DSSS depreading circuits can be used. The DSSS despreading circuit 214 uses an inner code 216 to despread the data from the A/D converter 212 (in digital form). For example, the DSSS despreading circuit 214 can be implemented by a code matched filter. The inner code 216 is a replica of the inner code originally used to spread the data in the transmitter. The clock recovery circuit 218 adjusts timing for the A/D converter 212. A separate code tracking loop maintains alignment of the replica code for the inner code to the partially despread sequence ($r_1$).

The despreaded output of the DSSS despreading circuit 214 is provided as an input to a data decoding circuit 220. For example, in a GPS system, the navigation message can be decoded. The data decoding circuit 220 can include circuits such as integrators and demodulators, and can share circuits with the DSSS despreading circuit 214. Conventional data decoding circuits can be used. The data decoding circuit 220 generates the despread sequence ($r_2$) as an output, which can then be used by error correction circuits, decrypting circuits, and the like.

The timing of the code can also be used to determine a range to the transmitter of the code. For example, in a GPS system, the transmitters (satellites) and the receivers are ultimately synchronized to GPS time. Measurement of the delay can be associated with a distance from the transmitter for measurement of range ΔR (output of ranging processor 222). For example, the range information can be used to determine position.

The speed of analog circuits, such as delay registers, can be adjusted by adjusting the voltage on throttling transistors. These transistors control the current flow in the circuit which in turn controls the speed at which the output can change. The voltage on the throttling transistors can be adjusted by a receiver synchronization loop. It should be noted that the range of adjustment for the timing of an analog circuit can be relatively small, and that a cascade of analog circuits can be used to provide a relatively large timing adjustment range.

With respect to analog circuits, preferably, differential signaling techniques (where both non-inverted and inverted are available) are used to permit the use of multiplexing instead of multiplying to implement multiplication by −1 or +1. A summing circuit in a current mode circuit can be readily implemented with a wired-OR configuration. An analog circuit can save power over a digital circuit at relatively high frequencies.

Hybrid Circuit

Figure 3:
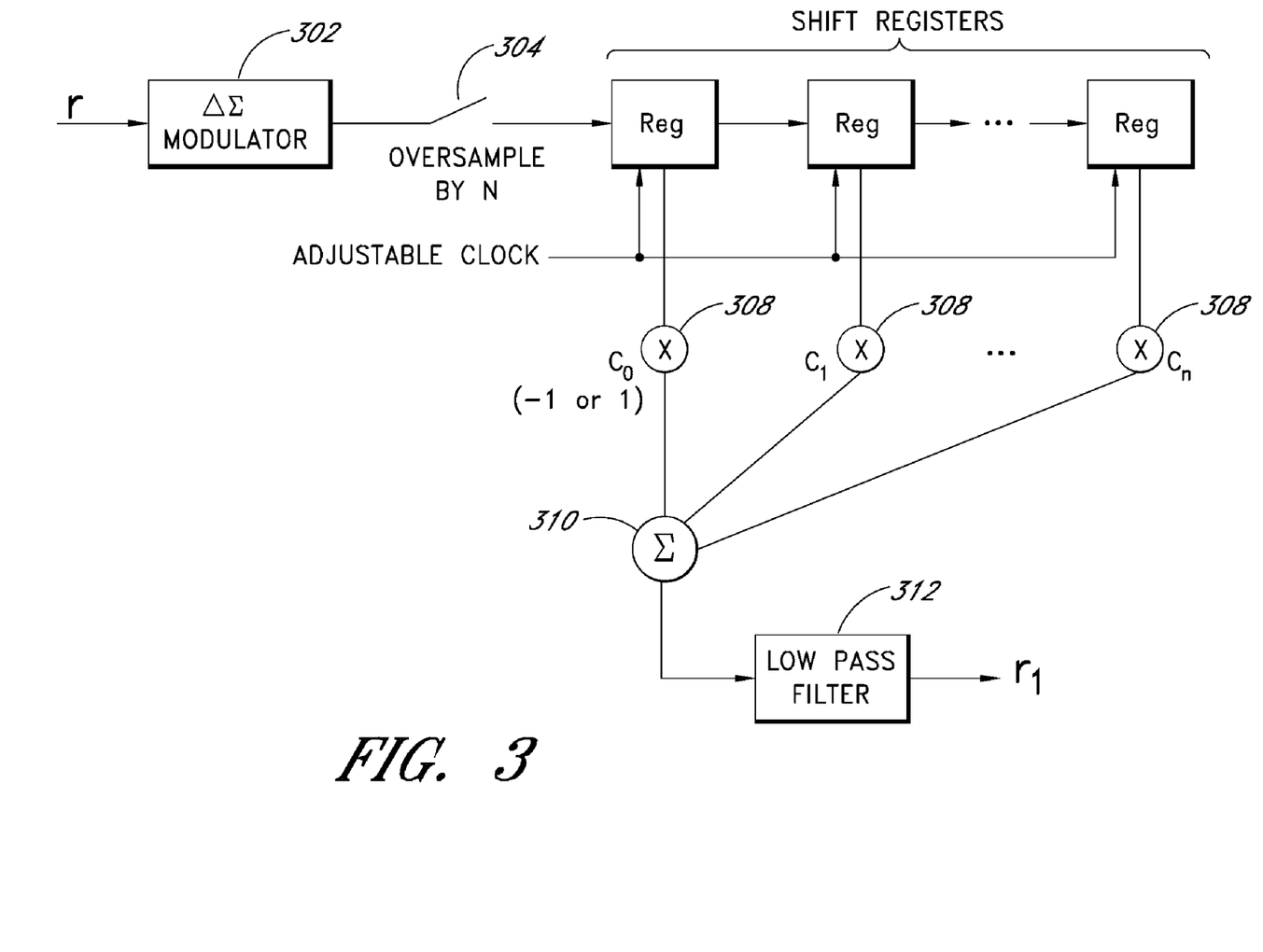
FIG. 3 illustrates an example of a hybrid analog and digital circuit for the outer code SS demodulator.

In one embodiment, the outer code SS demodulator 108 (FIG. 1) is implemented by a hybrid analog and digital circuit is used as illustrated in FIG. 3. The hybrid circuit simplifies the task of synchronizing the receiver by using digital shift registers as delay elements. The timing of data passing through the digital shift registers can be adjusted by adjusting the speed of a clock signal, such as from a clock synthesizer circuit.

The received spread spectrum sequence (r) (baseband) is provided as an input to a delta sigma modulator 302. The delta sigma modulator 302 provides an output that is quantized to, for example, one bit. The output is oversampled 304 by a factor of N, such as 8. Other values for N will be readily determined by one of ordinary skill in the art. The oversampling 304 pushes the noise out to high frequency, where it can be removed via low-pass filtering.

The oversampled data is provided as an input to the shift registers 306 (serial input), which are preferably implemented in differential form to also effectively implement multiplication 308 of the shifting data with code coefficients ($c_0, c_1, \ldots c_n$) for matching. With coefficient values of −1 and +1, the data can be multiplexed from a differential circuit to implement multiplication by the code coefficients. The outputs are summed by, for example, a summing circuit 310 and then low-passed filtered 312 to generate the partially despread sequence ($r_1$).

Transversal Filter

Figure 4:
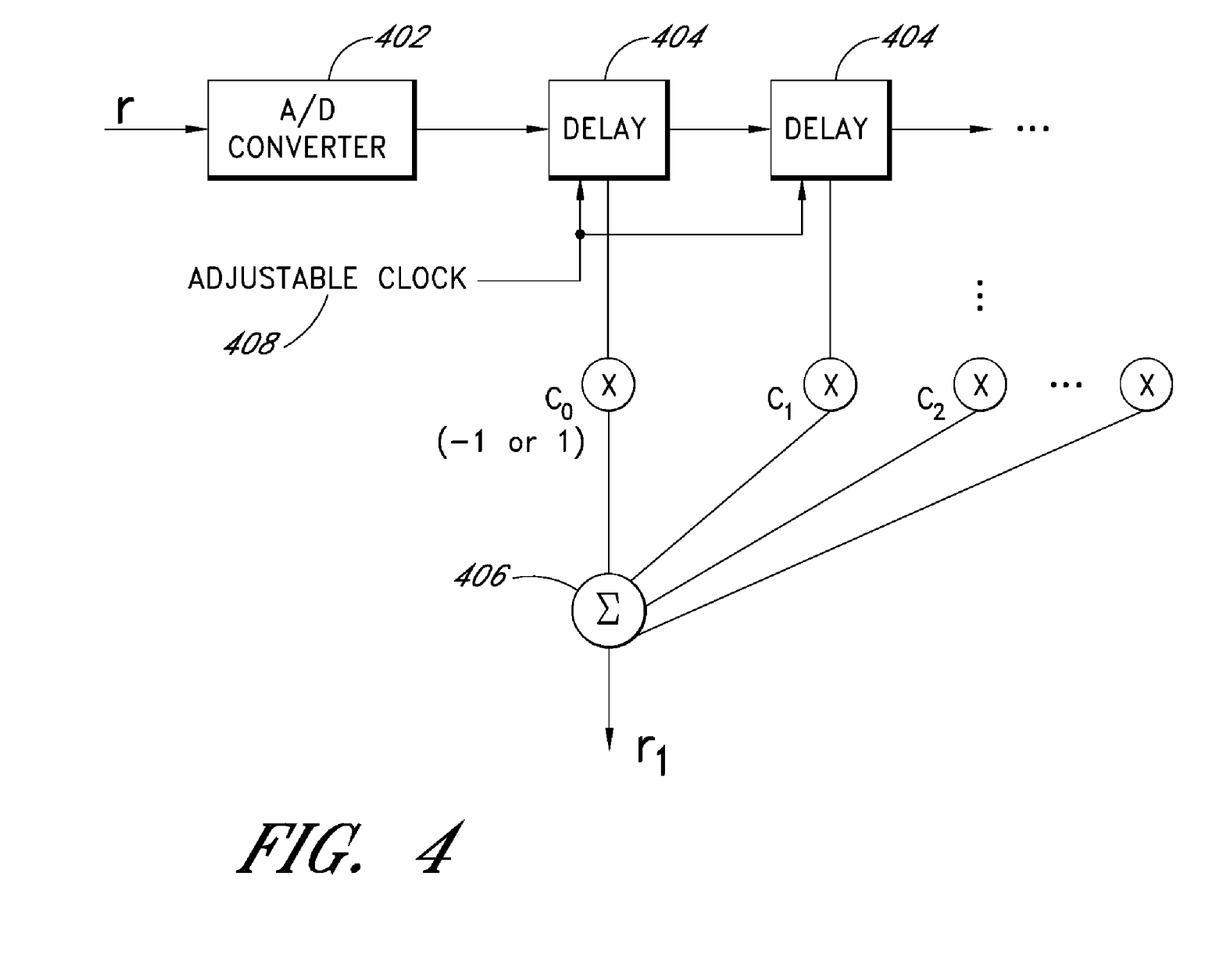
FIG. 4 illustrates an example of a digital transversal filter, which can be used for a digital domain implementation.

FIG. 4 illustrates a digital transversal filter, which is an example of a digital domain implementation for the outer code SS demodulator 108. The filter coefficients (replica code) are identical to the spreading code of the corresponding outer code SS modulator 104. In one embodiment, when the outer code SS modulator 104 uses a form of block coding, such as a ROM lookup table, a transversal filter is used to despread the symbols. An Analog to Digital converter (A/D converter) 402 converts the received spread spectrum sequence (r) (baseband) to digital. The digital signal is propagated through shift registers 404 for delay. In one embodiment, rather than using multipliers within the transversal filter to multiply coefficients ($c_0, c_1, c_2$, etc.) of the code, differential logic is used (such as CML). For example, rather than multiply by +1 or −1, when the inverted output is desired, it is collected instead, i.e., multiplexing. Summation 406 can be performed by a wire OR-ing circuit.

A transversal filter can also be referred to as a code-matched filter (in digital form), a digital matched filter, or a correlator. Algorithmic strength reduction filter techniques can be used. See, for example, "Hardware Efficient Fast Parallel FIR Filter Structures Based on Iterated Short Convolution," by Chao Cheng and Keshap K. Parhi, IEEE Transactions on Circuits and Systems, Vol. 51, No. 8, August 2004.

With digital domain receivers, the timing can be adjusted by using synchronous logic circuits which are operated using an adjustable clock signal 408. For example, a clock synthesis circuit can generate an adjustable speed clock signal, and the shifts between registers 404 is varied according to the speed of the clock signal 408.

In another embodiment, the transversal filter can be analog. Rather than using multiplexing and wire-ORing, multiplying DACs and summing circuits can be used in the analog circuit.

ADC Configuration

Figure 5:
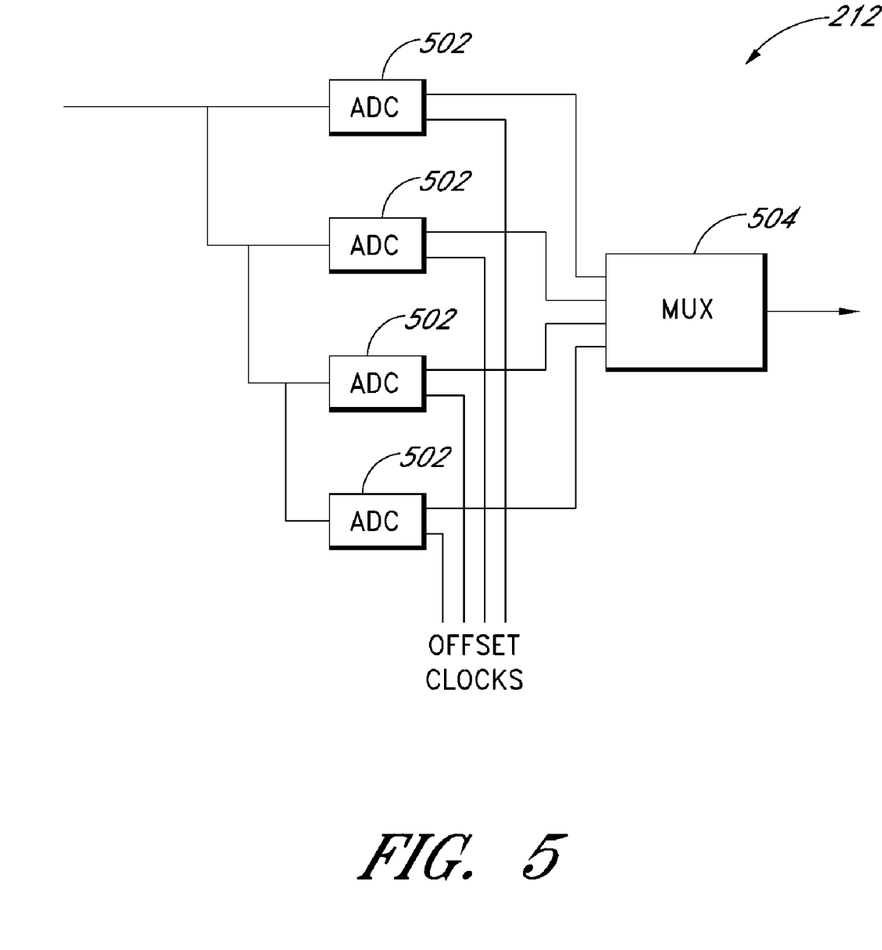
FIG. 5 illustrates a configuration of analog-to-digital converters with non-uniform timing.

As described earlier in connection with FIG. 2, the output of the outer code demodulator exhibits the characteristic of periodic correlation peaks. It is only for the duration of these correlation peaks that the signal is of interest. This allows the system to employ non-uniform analog-to-digital conversion (ADC). An ADC configuration is shown in FIG. 5.

Figure 6:
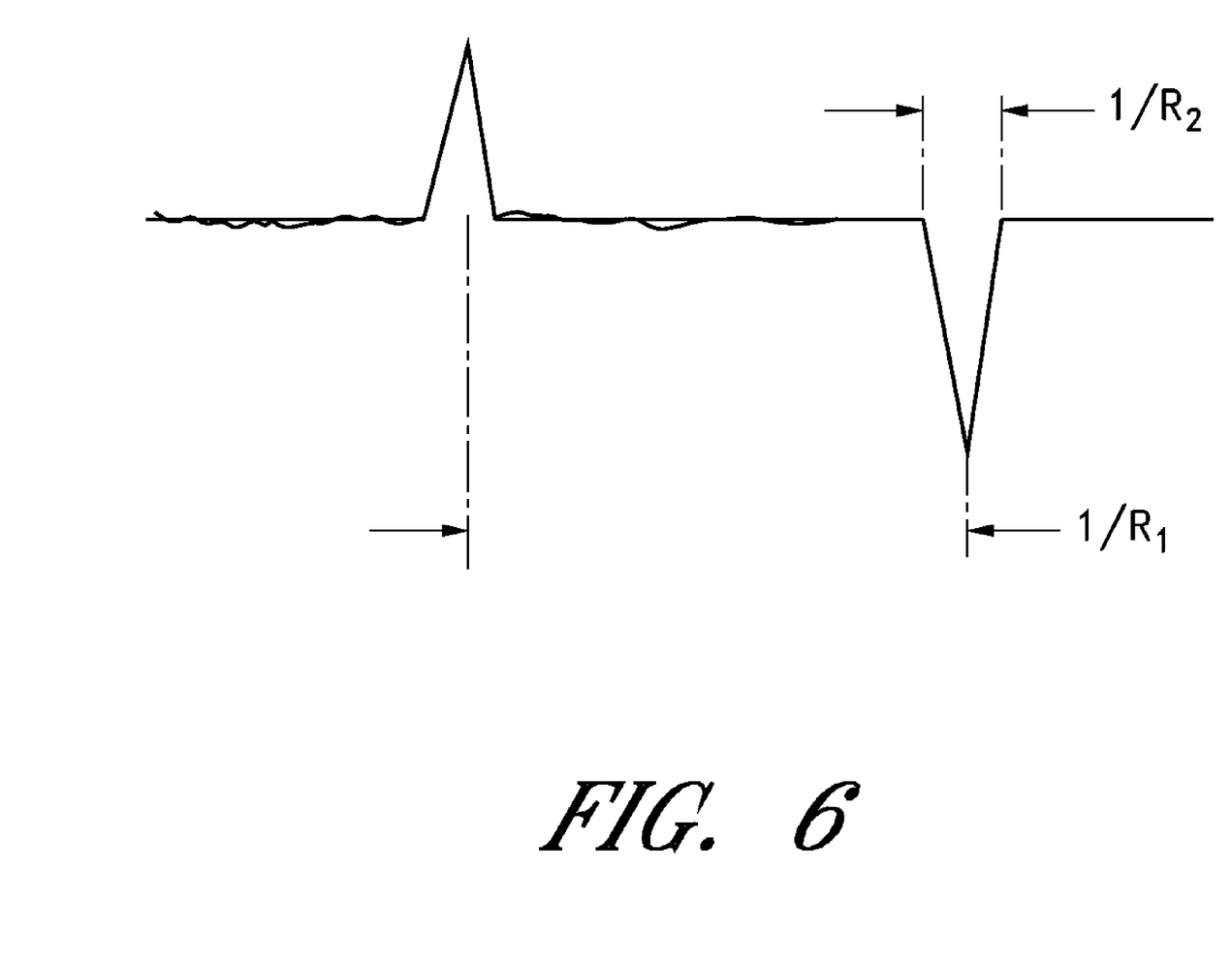
FIG. 6 illustrates an example of a waveform from an output of a code matched filter.

Two or more ADCs 502 are used to capture data around the correlation peaks of the outer code. While the sampling aperture of the ADCs should be very narrow (consistent with the high signal bandwidth), the conversion rate is low. That is, during other times, these ADCs can remain relatively inoperative, which can save power. In one example, four ADCs are used, and the sampling of each is offset from each other by about $1/R_2$, where $R_2$ is the rate of the outer code such that $1/R_2$ is about the width of the correlation peak as shown in FIG. 6. A multiplexer (mux) 504 selects the appropriate output to combine the outputs of the ADCs 502.

Ranging

The concatenated codes can also provide an advantageously large correlation peak for the outer code as shown in FIG. 6.

For example, when implemented in a system of nodes where the nodes have a relatively good timing reference, such as via GPS system time, the reception of the concatenated codes can be used to measure the distance between nodes. $1/R_2$ corresponds to the width of the correlation peak, where $R_2$ is the rate of the outer code SS modulation. $R_1$ is the rate of the inner code SS modulation.

For example, the precise time that a signal is transmitted can be known via GPS system time (e.g., can be provided in the data signal). A precise time of reception can also be known with reference to GPS system time (e.g., as determined by the correlation peak). The difference in time can then be used to determine the difference in range between the two nodes.

Alternatively, the range measurement can be based on the round trip propagation time of an exchange of messages between two nodes. This approach does not require an external time reference.

Various embodiments have been described above. Although described with reference to these specific embodiments, the descriptions are intended to be illustrative and are not intended to be limiting. Various modifications and applications may occur to those skilled in the art.

What is claimed is:

1. A method of despreading a spread spectrum sequence, the method comprising:
   receiving the spread spectrum sequence;
   partially despreading the spread spectrum sequence using an outer spreading code in analog domain to generate a partially despread sequence;
   despreading the partially despread sequence using an inner spreading code in digital domain to generate a despread sequence; and
   converting the partially despread sequence from analog to digital in a non-uniform manner such that more samples are converted near correlation peaks than at other times.

2. The method of claim 1, further comprising partially despreading in an analog code matched filter.

3. The method of claim 1, wherein receiving comprises downconverting from radio frequency to baseband.

4. The method of claim 1, further comprising using correlation peaks from partial despreading to determine range to a source of the spread spectrum sequence.

5. A method of despreading a spread spectrum sequence, the method comprising:
   receiving the spread spectrum sequence;
   partially despreading the spread spectrum sequence using an outer spreading code to generate a partially despread sequence, wherein partially despreading further comprises:
      filtering, oversampling, and quantizing the received spread spectrum signal using a delta sigma modulator to generate a reduced precision digital signal having quantization noise modulated to a higher frequency;
      providing the reduced precision digital signal to a serial input for shift registers;
      multiplying parallel outputs of the shift registers by a coefficients of replica code to generate products;
      summing the products to generate a sum; and
      low pass filtering the sum to generate the partially despread sequence; and
   despreading the partially despread sequence using an inner spreading code to generate a despread sequence.

6. The method of claim 5, wherein multiplying comprises multiplexing of differential signals to implement multiplication by filter coefficients having +1 or −1 values.

7. The method of claim 5, further comprising using correlation peaks from partial despreading to determine range to a source of the spread spectrum sequence.

8. A method of despreading a spread spectrum sequence, the method comprising:
   receiving the spread spectrum sequence;
   partially despreading the spread spectrum sequence using an outer spreading code to generate a partially despread sequence, wherein partially despreading further comprises:
      converting the received spread spectrum sequence to digital domain to generate a converted signal;
      providing the converted signal to a serial input for digital shift registers;
      multiplying parallel outputs of the shift registers in the digital domain by coefficients of a replica code to generate products; and
      summing the multiplication products in the digital domain to generate the partially despread sequence; and
   despreading the partially despread sequence using an inner spreading code to generate a despread sequence.

9. The method of claim 8, wherein multiplying comprises multiplexing of the parallel outputs of the shift registers, wherein the parallel outputs have both original and negated values, wherein the output for a shift register is selected based at least in part on the corresponding +1 or −1 filter coefficient value.

10. The method of claim 9, further comprising using correlation peaks from partial despreading to determine range to a source of the spread spectrum sequence.

11. An apparatus for despreading a spread spectrum sequence, the apparatus comprising:
   an outer code spread spectrum demodulator configured to receive the spread spectrum sequence and an outer spreading code as inputs, and to generate a partially despread sequence as an output, wherein the outer code spread spectrum demodulator comprises an analog circuit;
   an inner code spread spectrum demodulator configured to receive the partially despread sequence and an inner spreading code as inputs, and to generate a despread sequence as an output, wherein the inner code spread spectrum demodulator comprises a digital circuit; and
   an analog to digital converter coupled in a signal path between the outer code spread spectrum demodulator and the inner code spread spectrum demodulator, the analog to digital converter configured to convert the partially despread sequence in a non-uniform manner such that more samples are converted near correlation peaks than at other times.

12. The apparatus of claim 11, wherein the outer code spread spectrum demodulator comprises an analog code matched filter.

13. The apparatus of claim 11, further comprising a downconverter configured to downconvert a carrier for the spread spectrum sequence from radio frequency to baseband.

14. The apparatus of claim 11, further comprising a circuit configured to use correlation peaks from partial despreading to determine range to a source of the spread spectrum sequence.

15. The apparatus of claim 11, wherein the apparatus is embodied in a communications transceiver.

16. An apparatus for despreading a spread spectrum sequence, the apparatus comprising:
   an outer code spread spectrum demodulator configured to receive the spread spectrum sequence and an outer spreading code as inputs, and to generate a partially despread sequence as an output, wherein the outer code spread spectrum demodulator further comprises:
      a delta-sigma modulator coupled to receive the spread spectrum sequence, wherein the delta-sigma modulator is configured to generate a modulated signal;
      a sampler configured to oversample the modulated signal to generate an oversampled signal;
      shift registers configured to receive oversampled signal as a serial input;
      multiplying circuits configured to multiply parallel outputs of the shift registers by coefficients of a replica code to generate products;
      a summing circuit configured to sum the products to generate a sum; and
      a low pass filter configured received to receive the sum and to low pass filter the sum to generate the partially despread sequence; and
   an inner code spread spectrum demodulator configured to receive the partially despread sequence and an inner spreading code as inputs, and to generate a despread sequence as an output.

17. The apparatus of claim 16, wherein the multiplying circuits comprise multiplexing circuits.

18. The apparatus of claim 16, further comprising a circuit configured to use correlation peaks from partial despreading to determine range to a source of the spread spectrum sequence.

19. The apparatus of claim 16, wherein the apparatus is embodied in a communications transceiver.

20. An apparatus for despreading a spread spectrum sequence, the apparatus comprising:
   an outer code spread spectrum demodulator configured to receive the spread spectrum sequence and an outer spreading code as inputs, and to generate a partially despread sequence as an output, wherein the outer code spread spectrum demodulator further comprises:

an analog-to-digital converter configured to convert the received spread spectrum sequence to digital to generate a converted signal;

shift registers configured to receive the converted signal as a serial input;

multiplying circuits configured to generate products from parallel outputs of the shift registers and coefficients of a replica code; and a summing circuit configured to sum the multiplication products to generate the partially despread sequence; and an inner code spread spectrum demodulator configured to receive the partially despread sequence and an inner spreading code as inputs, and to generate a despread sequence as an output.

21. The apparatus of claim 20, wherein the multiplying circuits comprise multiplexing circuits.

22. The apparatus of claim 20, further comprising a circuit configured to use correlation peaks from partial despreading to determine range to a source of the spread spectrum sequence.

23. The apparatus of claim 20, wherein the apparatus is embodied in a communications transceiver.

* * * * *